United States Patent
Lee et al.

(10) Patent No.: US 9,484,392 B2
(45) Date of Patent: Nov. 1, 2016

(54) FLAT PANEL DISPLAY HAVING LOW REFLECTIVE BLACK MATRIX AND METHOD FOR MANUFACTURING THE SAME

(71) Applicant: LG Display Co., Ltd., Seoul (KR)

(72) Inventors: Jinbok Lee, Gyeonggi-do (KR); Yongil Kim, Chungcheongnam-do (KR); Eunhye Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 12 days.

(21) Appl. No.: 14/584,042

(22) Filed: Dec. 29, 2014

(65) Prior Publication Data

US 2015/0340412 A1    Nov. 26, 2015

(30) Foreign Application Priority Data

May 22, 2014 (KR) .................... 10-2014-0061756

(51) Int. Cl.
| | |
|---|---|
| *H01L 29/49* | (2006.01) |
| *H01L 27/32* | (2006.01) |
| *H01L 51/52* | (2006.01) |
| *H01L 51/56* | (2006.01) |

(52) U.S. Cl.
CPC ......... *H01L 27/3244* (2013.01); *H01L 27/322* (2013.01); *H01L 51/5268* (2013.01); *H01L 51/5271* (2013.01); *H01L 51/5284* (2013.01); *H01L 51/56* (2013.01); *H01L 2227/323* (2013.01); *H01L 2251/301* (2013.01); *H01L 2251/303* (2013.01); *H01L 2251/558* (2013.01)

(58) Field of Classification Search
CPC .. H01L 27/3244; H01L 27/322; H01L 51/56
See application file for complete search history.

(56) References Cited

U.S. PATENT DOCUMENTS

| 5,926,239 | A | * | 7/1999 | Kumar | .............. G02F 1/133617 |
| | | | | | 349/69 |
| 2002/0190652 | A1 | * | 12/2002 | Do | .......................... H01J 9/02 |
| | | | | | 313/587 |
| 2003/0011740 | A1 | * | 1/2003 | Tanaka | .............. G02F 1/133753 |
| | | | | | 349/177 |
| 2006/0221294 | A1 | * | 10/2006 | Liu | ...................... G02F 1/13394 |
| | | | | | 349/155 |
| 2007/0222922 | A1 | * | 9/2007 | Jin | ........................ C23C 14/027 |
| | | | | | 349/110 |
| 2008/0054802 | A1 | * | 3/2008 | Cok | .................... H01L 51/5284 |
| | | | | | 313/506 |
| 2008/0198140 | A1 | * | 8/2008 | Kinoshita et al. ...... G06F 3/042 |
| | | | | | 345/173 |

(Continued)

FOREIGN PATENT DOCUMENTS

CN          202189163        *   4/2012

*Primary Examiner* — Michael Shingleton
(74) *Attorney, Agent, or Firm* — Morgan, Lewis & Bockius LLP

(57) ABSTRACT

A flat panel display having a low reflective black matrix and a method for manufacturing the same are provided. The flat panel display includes a substrate having an open area and a non-open area; a hazy layer disposed in the non-open area on the inner surface of the substrate; a black matrix stacked on the hazy layer; a driving element disposed in the non-opening area; and a display element disposed in the open area and driven by the driving element.

4 Claims, 10 Drawing Sheets

(56) References Cited

U.S. PATENT DOCUMENTS

| | | | | |
|---|---|---|---|---|
| 2010/0220269 A1* | 9/2010 | Takama et al. | G02F 1/13338 | 349/106 |
| 2010/0253605 A1* | 10/2010 | Inada | G02F 1/136286 | 345/55 |
| 2012/0038267 A1* | 2/2012 | Hanamura et al. | H01L 27/322 | 313/504 |
| 2012/0038873 A1* | 2/2012 | Kim | G02F 1/133512 | 349/138 |
| 2012/0249944 A1* | 10/2012 | Yoshii | H01L 27/0296 | 349/152 |
| 2012/0313152 A1* | 12/2012 | Yokoi et al. | H01L 21/02554 | 257/288 |
| 2013/0134570 A1* | 5/2013 | Nishido | H01L 33/0095 | 257/680 |
| 2013/0146867 A1* | 6/2013 | Kita | H01L 29/786 | 257/43 |
| 2015/0185539 A1* | 7/2015 | Senokuchi | H05B 33/04 | 349/58 |
| 2015/0205092 A1* | 7/2015 | Sasagawa | B81C 1/00134 | 359/290 |
| 2015/0214282 A1* | 7/2015 | Adachi | H01L 27/3244 | 257/40 |
| 2015/0241724 A1* | 8/2015 | Okabe | G02F 1/13454 | 349/47 |
| 2015/0241749 A1* | 8/2015 | Yoon et al. | G02F 1/133377 | 349/46 |
| 2015/0262528 A1* | 9/2015 | Takahara | G09G 3/3225 | 345/212 |
| 2015/0301378 A1* | 10/2015 | Ishii et al. | G02F 1/1368 | 349/110 |
| 2015/0311260 A1* | 10/2015 | Senda et al. | G06F 3/044 | 257/40 |
| 2015/0340412 A1* | 11/2015 | Lee et al. | H01L 27/3244 | 257/88 |
| 2015/0356939 A1* | 12/2015 | Hsu et al. | G09G 3/3659 | 345/206 |

\* cited by examiner

FLAT PANEL DISPLAY HAVING LOW REFLECTIVE BLACK MATRIX AND METHOD FOR MANUFACTURING THE SAME

This application claims the benefit of Korea Patent Application No. 10-2014-0061756 filed on May 22, 2014, which is incorporated herein by reference for all purposes as if fully set forth herein.

BACKGROUND OF THE INVENTION

1. Field of the Invention

The present disclosure relates to a flat panel display, and more particularly, to a flat panel display having a low reflective black matrix and a method for manufacturing the same.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL). Especially, a high quality flat panel display adopting the low temperature poly silicon (or, LTPS) as the channel device is increasingly required.

The electroluminescence display device is categorized in the inorganic light emitting diode display device and the organic light emitting diode display device according to the luminescence material. As a self-emitting display device, the electroluminescence display device has the merits those the response speed is very fast, the brightness is very high and the view angle is large. Especially, because of high energy efficiency, low current leakage, and easiness of the color reproducing using the current control, the organic light emitting diode display is increasingly required.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the excition formed at the excitation state in which the hole and the electron are recombined at the emission layer EML.

The organic light emitting diode radiates the lights due to the energy from the excition formed at the excitation state in which the hole from the anode and the electron from the cathode are recombined at the emission layer EML. The organic light emitting diode display can represent the video data by controlling the amount (or 'brightness') of the light generated and radiated from the emission layer ELM of the organic light emitting diode as shown in FIG. 1.

The organic light emitting diode display (or OLED) using the organic light emitting diode can be categorized in the passive matrix type organic light emitting diode display (or PMOLED) and the active matrix type organic light emitting diode display (or AMOLED).

The active matrix type organic light emitting diode display (or AMOLED) shows the video data by controlling the current applying to the organic light emitting diode using the thin film transistor (or TFT).

FIG. 2 is the exemplary circuit diagram illustrating the structure of one pixel in the active matrix organic light emitting diode display (or AMOLED). FIG. 3 is the plane view illustrating the structure of AMOLED using the thin film transistor according to the related art. FIG. 4 is the cross sectional view along the cutting line I-I' in FIG. 3, for illustrating the structure of the bottom emission type AMOLED according to the related art. FIG. 5 is the cross sectional view along the cutting line I-I' in FIG. 3, for illustrating the structure of the top emission type AMOLED according to the related art. As the differences between the bottom emission type and the top emission type are not shown in the plane views, the FIG. 3 is used commonly.

Referring to FIGS. 2 and 3, the active matrix organic light emitting diode display comprises a switching thin film transistor ST, a driving thin film transistor DT connected to the switching thin film transistor ST, and an organic light emitting diode OLED connected to the driving thin film transistor DT. The scan line SL, the data line DL and the driving current line VDD are formed on the substrate SUB to define the pixel area. The organic light emitting diode OLED is formed within the pixel area to define the light emitting area.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED. The organic light emitting layer OLE is inserted between the anode electrode ANO and the cathode electrode CAT. The cathode electrode CAT is connected to the base voltage (or, ground voltage) VSS. There is a storage capacitance Cst is disposed between the gate electrode DG of the driving thin film transistor DT and the driving current line VDD or between the gate electrode DG of the driving thin film transistor DT and the drain electrode DD of the driving thin film transistor DT.

Referring to FIG. 4, we will explain about the bottom emission type organic light emitting diode display in detail. On the substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

As mentioned above, the substrate SUB having the thin film transistors ST and DT has uneven surface and level differences because there are many elements. It is preferable for the organic light emitting layer OL to be formed on even surface to ensure the uniformly light emitting distribution over all area of the organic light emitting layer OL. Therefore, in order to make the surface of the substrate SUB smooth, the over coat layer OC (or, the planar layer) is deposited over the substrate SUB.

On the over coat layer OC, an anode electrode ANO of the organic light emitting diode OLE is formed. Here, the anode electrode ANO is connected to the drain electrode DD of the driving thin film transistor DT via the pixel contact hole PH formed at the over coat layer OC and the passivation layer PAS.

On the substrate SUB having the anode electrode ANO, a bank (or 'bank pattern') BN is formed over the area having the switching thin film transistor ST, the driving thin film transistor DT and the various lines DL, SL and VDD, for defining the light emitting area. The exposed portion of the anode electrode ANO by the bank BN would be the light emitting area. On the anode electrode ANO exposed from the bank BN, the organic light emitting layer OL is formed. On the organic light emitting layer OL, the cathode electrode CAT is formed.

On the substrate SUB having the cathode electrode CAT, a spacer SP may be disposed. It is preferable that the spacer SP is disposed on the bank BM included in the non-light emitting area. The encap substrate ENC covers and is laminated on the upper side of the lower substrate SUB with the spacer SP between them. To join the encap substrate ENC and the lower substrate SUB, an adhesive layer or an adhesive material (not shown) may be inserted between them.

In the case of the bottom emission type and full-color AMOLED, the light emitted from the organic light emitting layer OL is radiated toward the lower substrate SUB. Therefore, it is preferable that the color filter CF is disposed between the overcoat layer OC and the passivation layer PAS, and the anode electrode ANO is made of a transparent conductive material. Further, it is preferable that the cathode electrode CAT includes a metal material having good reflective property for reflecting the light from the organic light emitting layer OL toward the lower substrate SUB. In addition, the organic light emitting layer OL may include an organic material generating the white light. The organic light emitting layer OL and the cathode electrode CAT may be deposited as covering the whole surface of the lower substrate SUB.

Hereinafter, referring to FIG. 5, we will explain about the top emission type full color organic light emitting diode display. The basic structure is very similar with the bottom emission type. Therefore, the explanation about the same structure may not be mentioned. For the case of the top emission type, the light from the organic light emitting layer OL is radiated toward the encap substrate ENC disposed over the lower substrate SUB. Therefore, it is preferable that the anode electrode ANO has a good reflective property and the cathode electrode CAT is made of a transparent conductive material.

In order to reproduce/represent the full color, the organic light emitting layer OL in each pixel may include any one color among red, green and blue which is disposed in each pixel. The cathode electrode CAT may be deposited as covering the whole surface of the lower substrate SUB. Otherwise, the organic light emitting layer OL may include an organic material generating the white light, and a color filter CF may be disposed on the organic light emitting layer OL or on the cathode electrode CAT. Here, in convenience, the figure shows that the color filter CF is disposed on the cathode electrode CAT. The color filter CF may be arrayed in the order of red R, green G and blue B.

For the bottom emission type, the user may see the video information at the lower substrate SUB side. On the contrary, for the top emission type, the user may see the video information at the encap substrate ENC side. Therefore, lights incident from the outside may be reflected by outside surface of the lower substrate SUB or the encap substrate ENC so that the reflective light may hinder the observation feeling and quality of the user. Especially, in the case that black matrix are disposed between each pixel, the light may be further reflected by the surface of the black matrix so that the video quality may be worse.

To prevent these drawbacks, in one method, a λ/4 polarization sheet may be attached on the display panel at the observation side. For example, in the bottom emission type, the polarization plate may be attached on the outer surface of the lower substrate SUB. In the top emission type, the polarization plate or sheet may be attached on the outer surface of the encap substrate ENC. However, with the polarization sheet or plate, the overall light transmissivity may be degraded. As the whole brightness of the display may be lowered, higher power consumption may be required for ensuring enough brightness.

SUMMARY OF THE INVENTION

Accordingly, the present invention is directed to a flat panel display having a low reflective black matrix and method for manufacturing the same that substantially obviated one or more of the problems due to limitations and disadvantages of the related art.

An object of the present invention is to provide a flat panel display without a polarization sheet or plate for preventing light reflection and a method for manufacturing the same.

Another object of the present invention is to provide a flat panel display comprising a low reflective black matrix for reducing the reflective light by the black matrix disposed between each pixel, and a method for manufacturing the same.

Yet another object of the present invention is to provide a flat panel display comprising a black matrix having a low reflective property for removing any polarization sheet or plate for reducing the light reflection and for enhancing the color property, and a method for manufacturing the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, a flat panel display comprises a substrate having an open area and a non-open area; a hazy layer disposed in the non-open area on the inner surface of the substrate; a black matrix stacked on the hazy layer; a driving element disposed in the non-opening area; and a display element disposed in the open area and driven by the driving element.

In another aspect, a method for manufacturing a flat panel display comprises forming an inorganic layer on a substrate; forming a hazy layer having a highered roughness by conducting a surface treatment on a surface of the inorganic layer; forming a black matrix on the hazy layer; patterning the hazy layer using the black matrix as a mask; and forming a display element on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
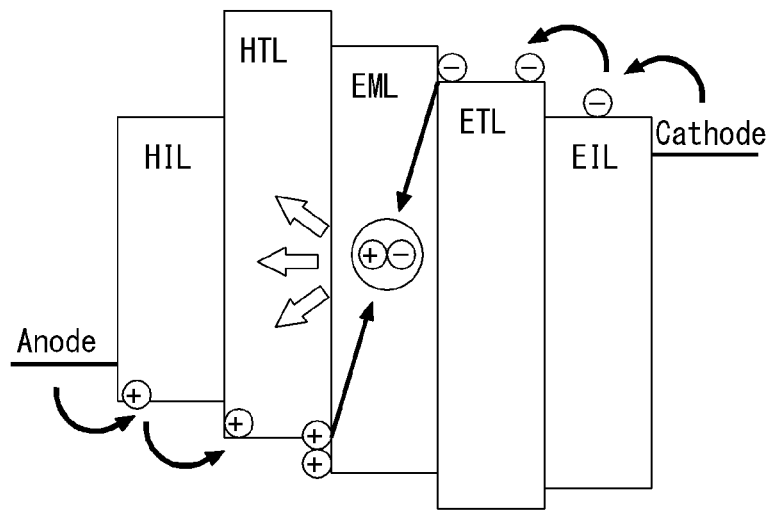
FIG. 1 is a diagram illustrating the structure of the organic light emitting diode according to the related art.
Figure 2:
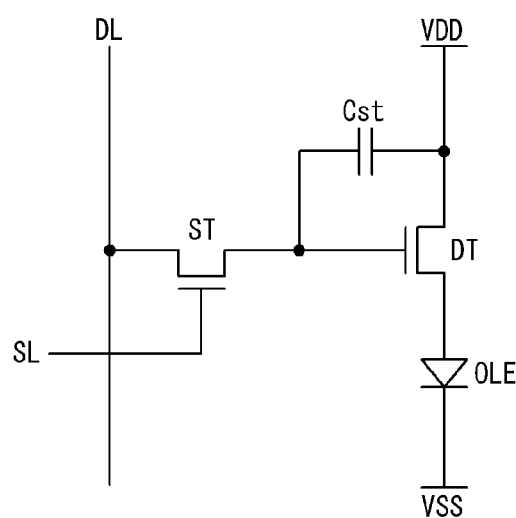
FIG. 2 is the exemplary circuit diagram illustrating the structure of one pixel in the active matrix organic light emitting diode display (or AMOLED) according to the related art.
Figure 3:
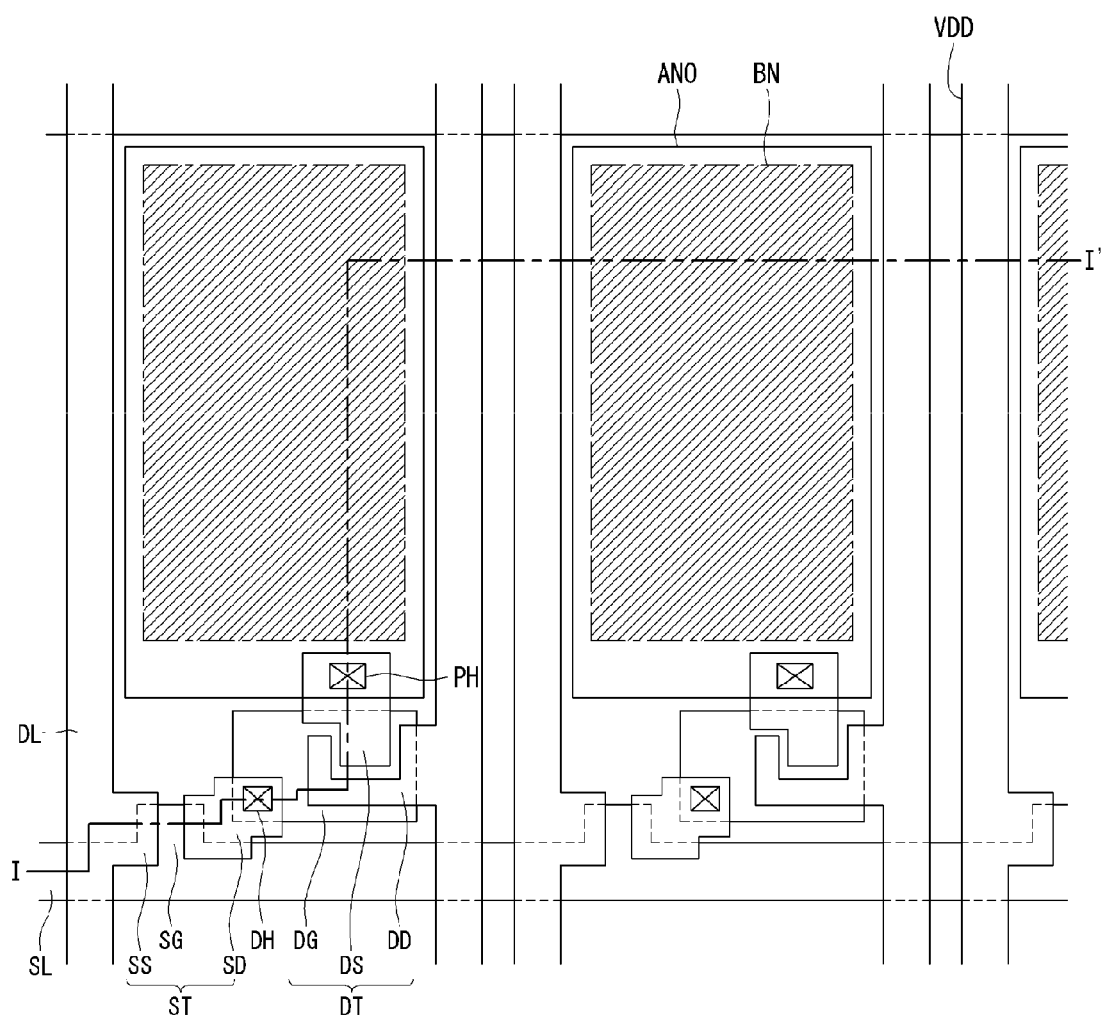
FIG. 3 is the plane view illustrating the structure of AMOLED using the thin film transistor according to the related art.
Figure 4:
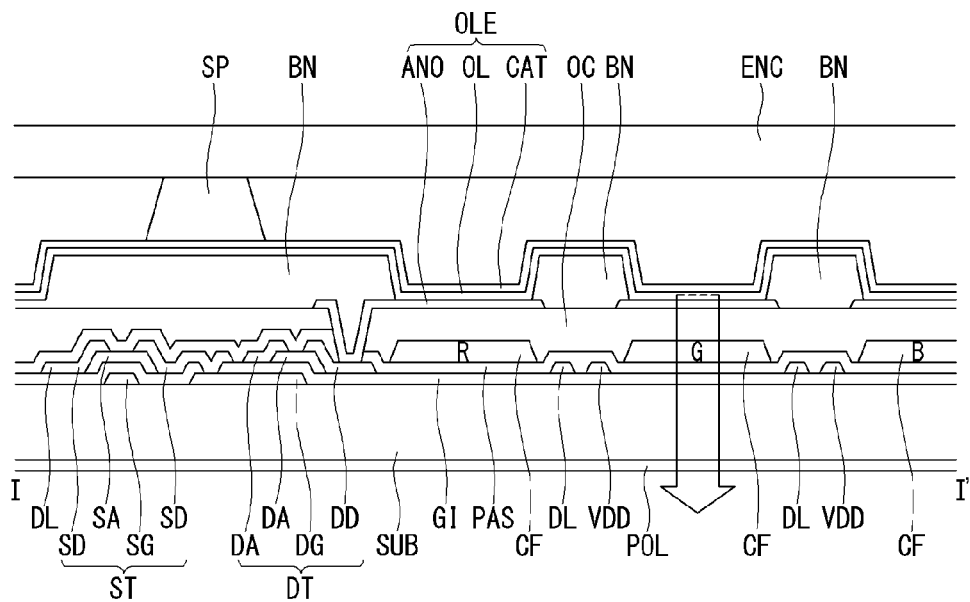
FIG. 4 is the cross sectional view along the cutting line I-I' in FIG. 3, for illustrating the structure of the bottom emission type AMOLED according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 6:
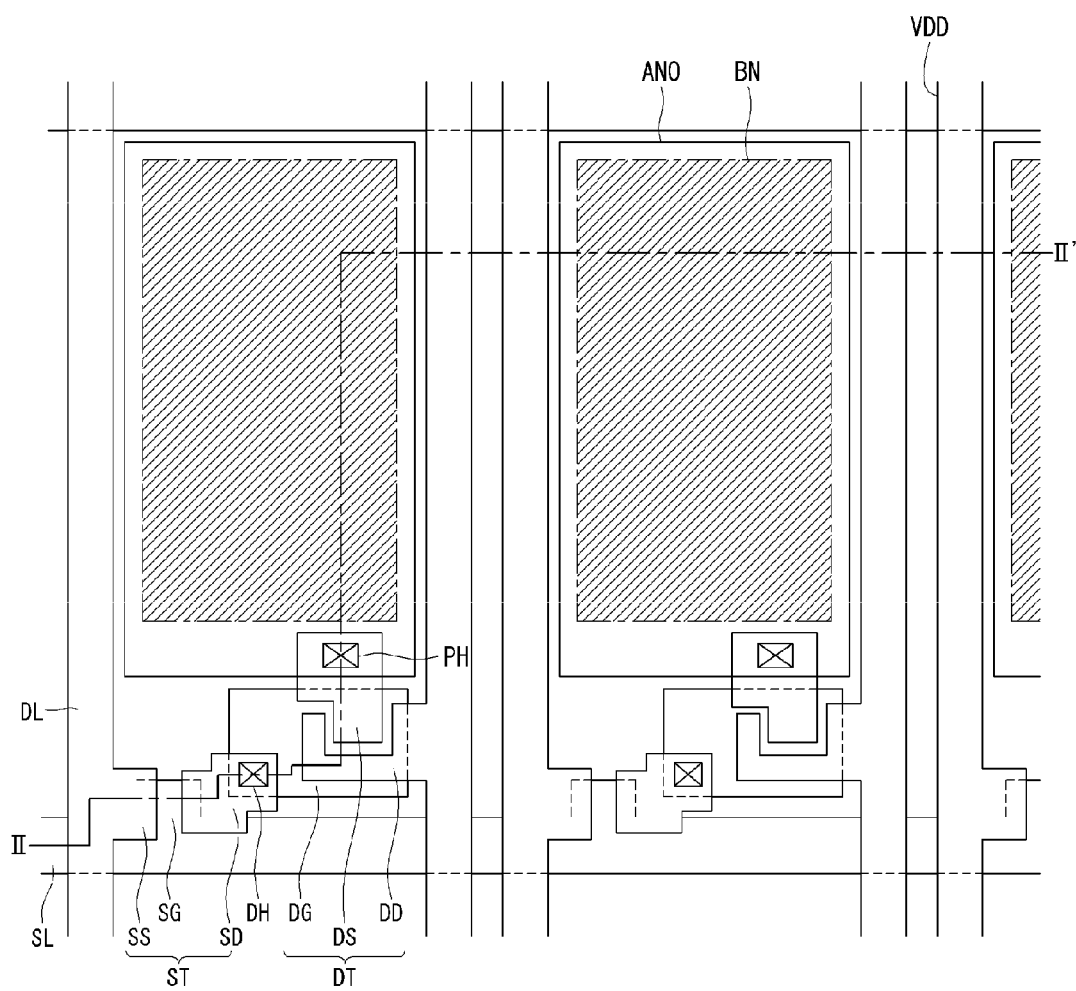
FIG. 6 is a plane view illustrating a structure of an organic light emitting diode display using a thin film transistor according to the present disclosure.
Figure 7:
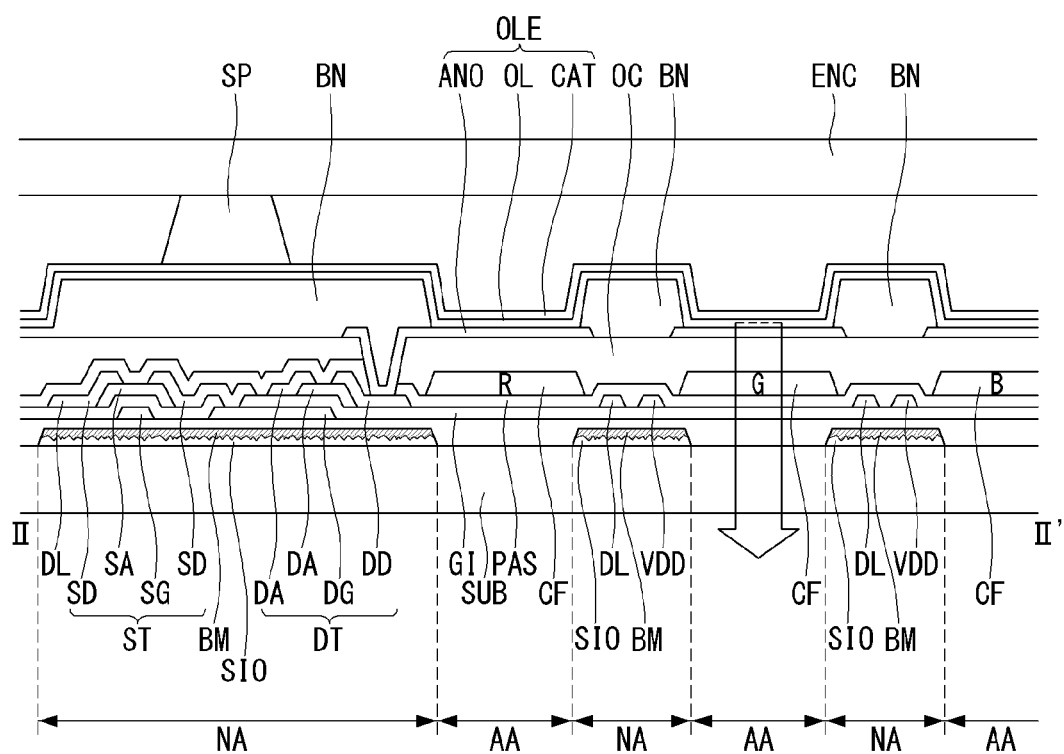
FIG. 7 is a cross sectional view along the cutting line II-II' in the FIG. 6 for illustrating a structure of a bottom emission type AMOLED according to the first embodiment of the present disclosure.

Hereinafter, referring to FIGS. 6 and 7, we will explain about the first embodiment of the present disclosure. FIG. 6 is a plane view illustrating a structure of an organic light emitting diode display using a thin film transistor according to the present disclosure. FIG. 7 is a cross sectional view along the cutting line II-II' in the FIG. 6 for illustrating a structure of a bottom emission type AMOLED according to the first embodiment of the present disclosure.

A bottom emission type organic light emitting diode display according to the first embodiment of the present disclosure has a plurality of pixel areas disposed on a substrate SUB in a matrix manner. Each pixel area includes an open area AA where an organic light emitting diode for representing the pixel data into video information is formed, and a non-open area NA where various elements for driving the organic light emitting diode is disposed.

On the substrate SUB, gate electrodes SG and DG for a switching thin film transistor ST and a driving thin film transistor DT, respectively are formed. On the gate electrodes SG and DG, a gate insulating layer GI is deposited. On some portions of the gate insulating layer GI overlapping with the gate electrodes SG and DG, semiconductor layer SA and DA are formed. On the semiconductor layers SA and DA, source electrodes SS and DS and drain electrodes SD and DD which are facing and apart from each other with a predetermined distance, respectively, are formed. The drain electrode SD of the switching thin film transistor ST is contacted to the gate electrode DG of the driving thin film transistor DT via the drain contact hole DH penetrating the gate insulator GI. A passivation layer PAS is deposited on the substrate SUB having the switching thin film transistor ST and the driving thin film transistor DT.

As mentioned above, the substrate SUB having the thin film transistors ST and DT has uneven surface and level differences because there are many elements. In order to make the surface of the substrate SUB smooth, the over coat layer OC (or, the planar layer) is deposited over the substrate SUB.

On the over coat layer OC, an anode electrode ANO of the organic light emitting diode OLE is formed. Here, the anode electrode ANO is connected to the drain electrode DD of the driving thin film transistor DT via the pixel contact hole PH formed at the over coat layer OC and the passivation layer PAS.

On the substrate SUB having the anode electrode ANO, a bank (or 'bank pattern') BN is formed over the area having the switching thin film transistor ST, the driving thin film transistor DT and the various lines DL, SL and VDD, for defining an open area AA (or, light emitting area). The exposed portion of the anode electrode ANO by the bank BN would be the open area AA. On the anode electrode ANO exposed from the bank BN, the organic light emitting layer OL is deposited. On the organic light emitting layer OL, the cathode electrode CAT is formed.

On the substrate SUB having the cathode electrode CAT, a spacer SP may be disposed. It is preferable that the spacer SP is disposed on the bank BM included in the non-open are NA (or, non-light emitting area). The encap substrate ENC covers and is laminated on the upper side of the lower substrate SUB with the spacer SP between them. To join the encap substrate ENC and the lower substrate SUB, an adhesive layer or an adhesive material (not shown) may be inserted between them.

In the case of the bottom emission type and full-color AMOLED, the light emitted from the organic light emitting layer OL is radiated toward the lower substrate SUB. Therefore, it is preferable that the color filter CF is disposed between the overcoat layer OC and the passivation layer PAS, and the anode electrode ANO is made of a transparent conductive material. Further, it is preferable that the cathode electrode CAT includes a metal material having good reflective property for reflecting the light from the organic light emitting layer OL toward the lower substrate SUB. In addition, the organic light emitting layer OL may include an organic material generating the white light. The organic light emitting layer OL and the cathode electrode CAT may be deposited as covering the whole surface of the lower substrate SUB.

When using the bottom emission type organic light emitting diode display, the user sees or observes the video information from the outer surface of the substrate SUB. A black matrix BM may be further included on the inner surface of the substrate SUB facing the user, and the black matrix BM is covering the non-open area NA. The black matrix BM can prevent from the color distortion by mixing of the neighboring two colors (i.e. red and green or green and blue). Further, the black matrix BM can prevent from the outer light being reflected by the thin film transistors ST and DT or lines DL, GL and VDD.

That is, it is preferable that the black matrix BM is made of black material. However, all black material has some reflective property, even though it is a low degree. Therefore, out light may be reflected by the black matrix BM so the reflected light may be noticed by user. Further, when the display is not used, due to the black matrix BM, the non-open area NA may has higher reflectiveness than the open area AA. As the result, black strips may be noticed by the user so that the viewing quality of the display may be degraded. In addition, when the display is operated, due to the reflected light by the black matrix BM, the color of the display may be distorted so that the original color is not properly reproduced or represented.

In the first embodiment of the present disclosure, a hazy layer SIO is further included under the black matrix BM for solving the problem of reflective light by the black matrix BM disposed at the non-open area of the bottom emission type organic light emitting diode display. Between the black matrix BM and the substrate SUB, the hazy layer SIO is inserted. The hazy layer SIO may include an inorganic material such as a silicon oxide SiOx, a silicon nitride SiNx, or an amorphous silicon a-Si. Especially, it is preferable that the hazy layer SIO has a high roughness getting by conducting a surface treatment on the interface with the black matrix BM.

Figure 11:
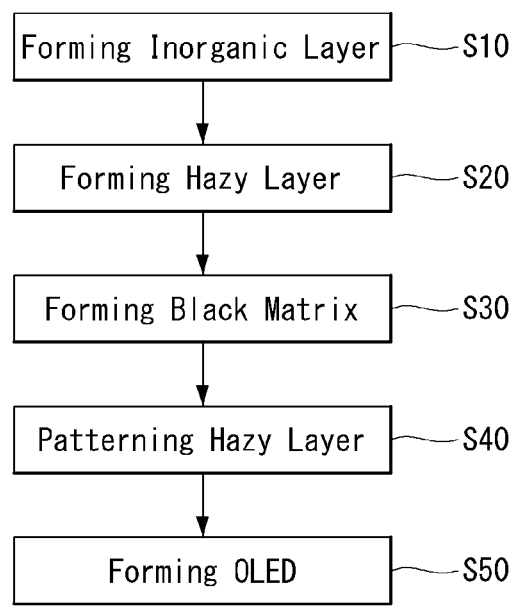
FIG. 11 is a flow chart illustrating a method for manufacturing an organic light emitting diode display according to the present disclosure.

Hereinafter, referring to FIGS. 9A to 9E and 11, we will explain about a method for manufacturing a bottom emission type organic light emitting diode display according to the first embodiment of the present disclosure. FIGS. 9A to 9E are cross sectional views illustrating a method for manufacturing a bottom emission type AMOLED according to the first embodiment of the present disclosure. FIG. 11 is a flow chart illustrating a method for manufacturing an organic light emitting diode display according to the present disclosure. Here, the figures show forming the black matrix BM including a hazy layer SIO within the non-open area and forming the buffer layer BM. The after-processes are not so important in the present disclosure so that we do not explain about them, for convenience.

Figure 9A:
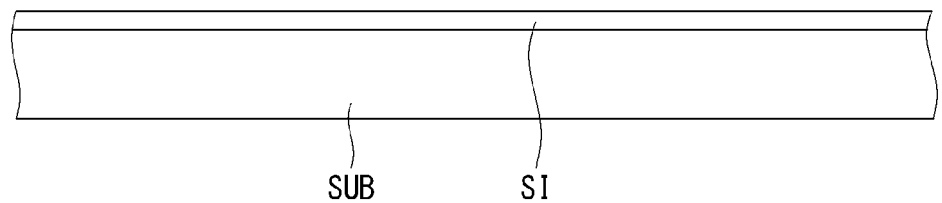
FIGS. 9A to 9E are cross sectional views illustrating a method for manufacturing a bottom emission type AMOLED according to the first embodiment of the present disclosure.

As shown in FIG. 9A, on the inner surface of the substrate SUB, an inorganic layer SI is formed by depositing a silicon oxide SiOx, a silicon nitride SiNx or an amorphous silicon a-Si with a thickness of 200 Å to 5,000 Å. As using the depositing method for inorganic material, the inorganic layer SI has a low roughness, i.e., the surface is very smooth or in even condition. Therefore, the inorganic layer SI, as it is, may not be used as an element for reducing the reflections. (referring to S10 in FIG. 11)

Figure 9B:
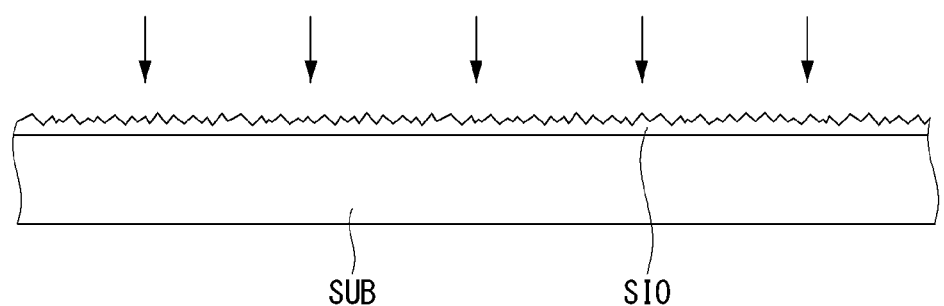

As shown in FIG. 9B, conducting a surface treatment on the top surface of the inorganic layer SI, the surface of the inorganic layer SI is made to have the highered roughness so that a hazy layer SIO is formed. For example, using a dry etching process or a wet etching process, the top surface of the inorganic layer SI can have the highered roughness. Otherwise, using a plasma treatment, the some thickness of the inorganic layer SI can be irregularly oxide, so that the top surface of the inorganic layer SI can have the highered roughness. (referring to S20 in FIG. 11)

Figure 9C:
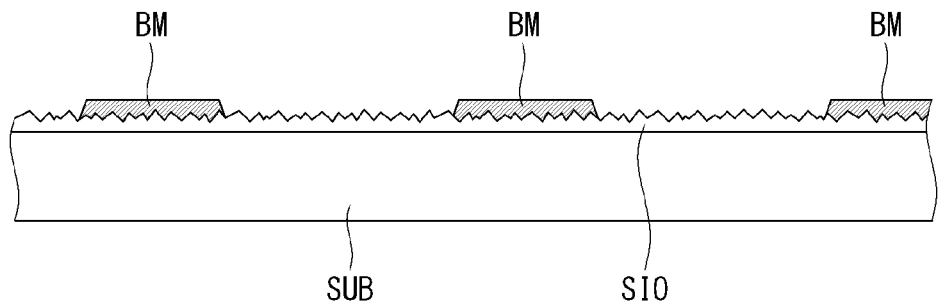

As shown in FIG. 9C, depositing a black material and patterning it, a black matrix BM is formed over the non-open area NA. In the non-open area NA, thin film transistors ST and DT and lines SL, DL and VDD are formed later. (referring to S30 in FIG. 11)

Figure 9D:
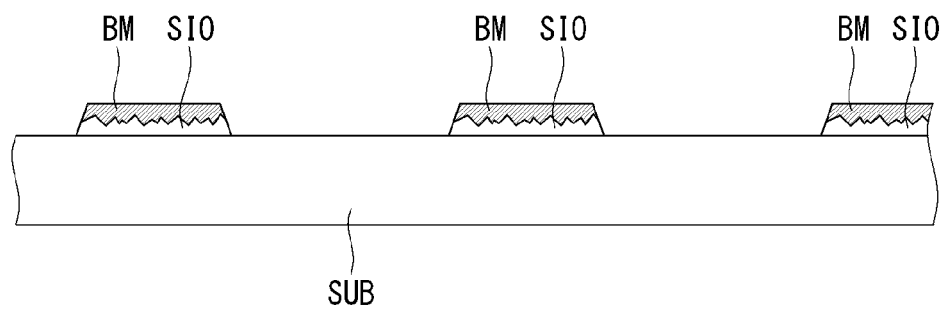

As shown in FIG. 9D, patterning the hazy layer SIO using the black matrix BM as a mask, the portions of the hazy layer SIO covering the open area AA are removed. The interface between the black matrix BM and the hazy layer SIO has the highered roughness, and the black matrix BM and the hazy layer SIO are stacked. On the other hands, in the open area AA, there is no hazy layer SIO. (referring to S40 in FIG. 11)

Figure 9E:
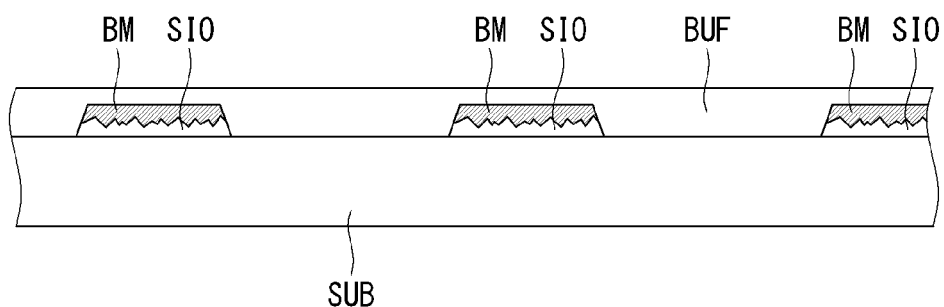

As shown in FIG. 9E, a buffer layer BUF is deposited on the substrate SUB having the black matrix BM and the hazy layer SIO which are stacked in the non-open area NA only. As the black matrix BM and the hazy layer SIO is disposed in the non-open area only, the surface of the substrate SUB is not even or smooth condition. If thin film transistors ST and DT and organic light emitting diode OLE are formed on the uneven surface, it is not ensure the properties of the elements. Therefore, it is preferable that the buffer layer BUF is deposited on the substrate SUB for getting even surface. After that, even though it is not shown in the figures, the thin film transistors ST and DT are formed, the color filter CF is formed, and the organic light emitting diode OLE including the anode electrode ANO, the organic light emitting layer OL and the cathode electrode CAT is formed. (referring to S50 in FIG. 11)

Figure 5:
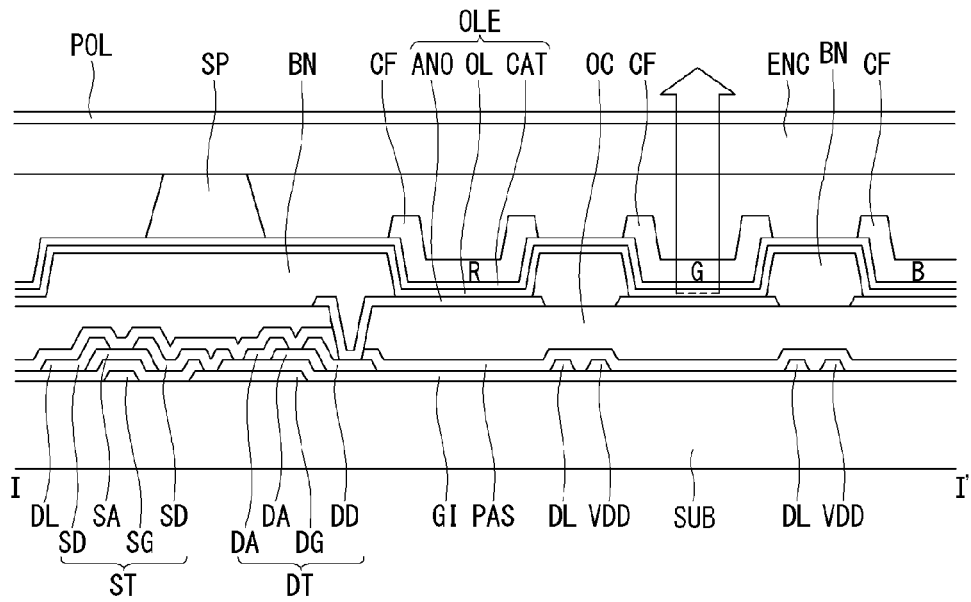
FIG. 5 is the cross sectional view along the cutting line I-I' in FIG. 3, for illustrating the structure of the top emission type AMOLED according to the related art.
Figure 8:
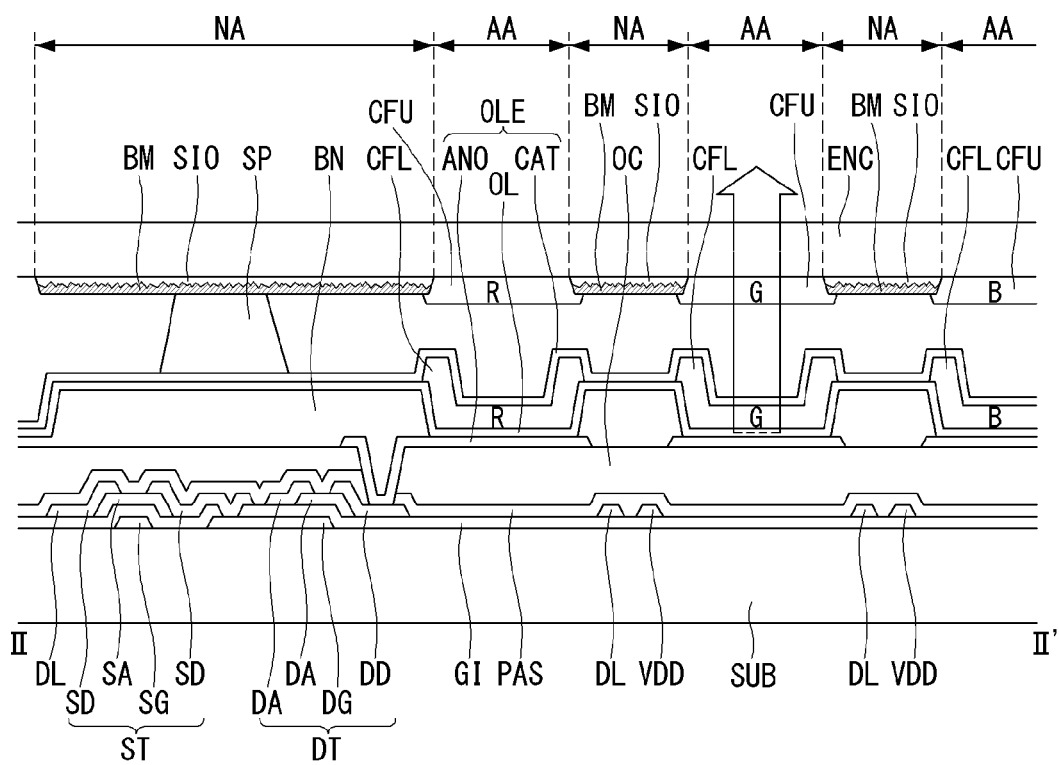
FIG. 8 is a cross sectional view along the cutting line II-II' in the FIG. 5 for illustrating a structure of a top emission type AMOLED according to the second embodiment of the present disclosure.

Hereinafter, referring to FIG. 8, we will explain about a top emission type full color organic light emitting diode display according to the second embodiment of the present disclosure. FIG. 8 is a cross sectional view along the cutting line II-II' in the FIG. 5 for illustrating a structure of a top emission type AMOLED according to the second embodiment of the present disclosure. The basic structure of the top emission type organic light emitting diode display is very similar with that of the bottom emission type. Therefore, the similar or common structures will not be explained.

For the case of the top emission type, the light from the organic light emitting layer OL is radiated toward the encap substrate ENC disposed over the lower substrate SUB. Therefore, it is preferable that the anode electrode ANO is made of a material having a good reflective property and the cathode electrode CAT is made of a transparent conductive material.

In order to reproduce/represent the full color, the organic light emitting layer OL in each pixel may include any one color among red, green and blue which is disposed in each pixel. The cathode electrode CAT may be deposited as covering the whole surface of the lower substrate SUB. Otherwise, the organic light emitting layer OL may include an organic material generating the white light, and a color filter CF may be disposed on the organic light emitting layer OL or on the cathode electrode CAT.

Here, in convenience, we will explain about that the lower color filter CFL is disposed between the organic light emitting layer OL and the cathode electrode CAT. The lower color filter CFL includes a red color filter R, a green color filter G and a blue color filter B. In addition, the thicknesses of each lower color filter CFL are different each other. This means that the organic light emitting diode display adopts a micro-cavity structure for enhancing the color efficiency. That is, in order to make the distance between the anode electrode ANO and the cathode electrode CAT be corresponding to the integer times of the wavelength of the color, the thickness of the lower color filter CFL may be controlled in each color pixel. To illustrate these structural features in the figures, the thickness of the lower color filter CFL is shown as being very thick. Actually, it is preferable that the lower color filter CFL has proper thickness to get enough brightness at the organic light emitting layer OL inserted between the anode electrode ANO and the cathode electrode CAT.

Further, in the second embodiment, in order to enhance the color purity, an upper color filter CFU may be further included at the inner surface of the encap substrate ENC. It is preferable that the upper color filter CFU may be disposed as being overlapped with the lower color filter CFL exactly.

For the top emission type organic light emitting diode display, the user sees or observes the video information at the outer side of the encap substrate ENC. A black matrix BM may be further included on the inner surface of the encap substrate ENC facing the user, and the black matrix BM is covering the non-open area NA. The black matrix BM can prevent from the color distortion by mixing of the neighboring two colors (i.e. red and green or green and blue).

For example, it is preferable that the black matrix BM is made of black material. However, all black material has some reflective property, even though it is a low degree. Therefore, out light may be reflected by the black matrix BM so the reflected light may be noticed by user. Further, when the display is not used, due to the black matrix BM, the non-open area NA may has higher reflectiveness than the open area AA. As the result, black strips may be noticed by the user so that the viewing quality of the display may be degraded. In addition, when the display is operated, due to the reflected light by the black matrix BM, the color of the display may be distorted so that the original color is not properly reproduced or represented.

In the second embodiment of the present disclosure, a hazy layer SIO is further included under the black matrix BM for solving the problem of reflective light by the black matrix BM disposed at the non-open area of the top emission type organic light emitting diode display. Between the black matrix BM and the encap substrate ENC, the hazy layer SIO is inserted. The hazy layer SIO may include an inorganic material such as a silicon oxide SiOx, a silicon nitride SiNx, or an amorphous silicon a-Si. Especially, it is preferable that the hazy layer SIO has a highered roughness getting by conducting a surface treatment on the interface with the black matrix BM.

Hereinafter, referring to FIGS. 10A to 10E and 11, we will explain about a method for manufacturing a top emission type organic light emitting diode display according to the first embodiment of the present disclosure. FIGS. 10A to 10E are cross sectional views illustrating a method for manufacturing a top emission type AMOLED according to the second embodiment of the present disclosure. Here, the figures show forming the black matrix BM including a hazy layer SIO within the non-open area and forming the buffer layer BM. The after-processes are not so important in the present disclosure so that we do not explain about them, for convenience.

Figure 10A:
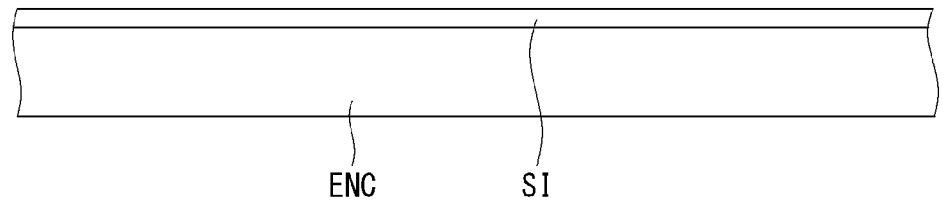
FIGS. 10A to 10E are cross sectional views illustrating a method for manufacturing a top emission type AMOLED according to the second embodiment of the present disclosure.

As shown in FIG. 10A, on the inner surface of the encap substrate ENC, an inorganic layer SI is formed by depositing a silicon oxide SiOx, a silicon nitride SiNx or an amorphous silicon a-Si with a thickness of 200 Å to 5,000 Å. As using the depositing method for inorganic material, the inorganic layer SI has a low roughness, i.e., the surface is very smooth or in even condition. Therefore, the inorganic layer SI, as it is, may not be used as an element for reducing the reflections. (referring to S10 in FIG. 11)

Figure 10B:
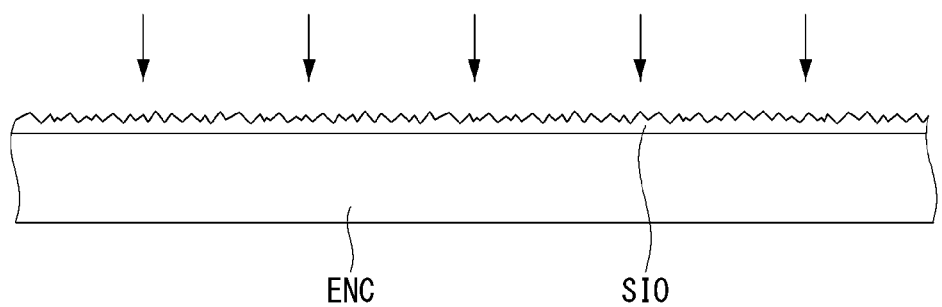

As shown in FIG. 10B, conducting a surface treatment on the top surface of the inorganic layer SI, the surface of the inorganic layer SI is made to have high roughness so that a hazy layer SIO is formed. For example, using a dry etching process or a wet etching process, the top surface of the inorganic layer SI can have the highered roughness. Otherwise, using a plasma treatment, the some thickness of the inorganic layer SI can be irregularly oxide, so that the top surface of the inorganic layer SI can have the highered roughness. (referring to S20 in FIG. 11)

Figure 10C:
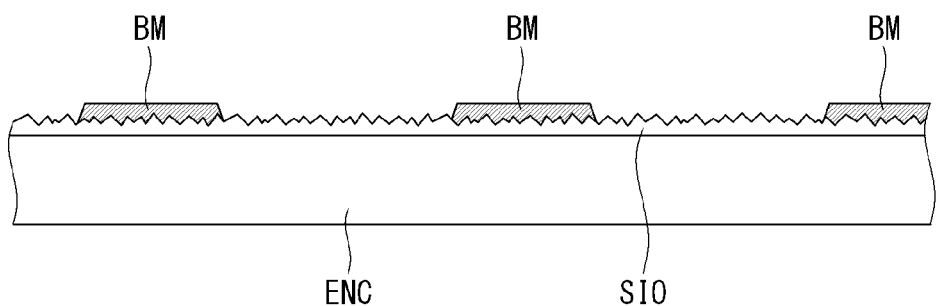

As shown in FIG. 10C, depositing a black material and patterning it, a black matrix BM is formed over the non-open area NA. The non-open area NA may be overlapped with thin film transistors ST and DT and lines SL, DL and VDD formed later. (referring to S30 in FIG. 11)

Figure 10D:
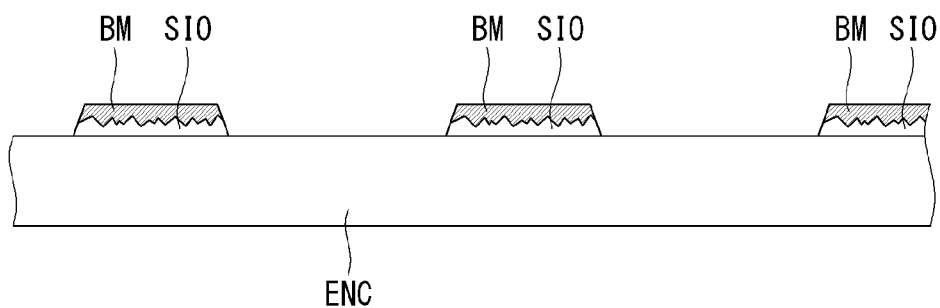

As shown in FIG. 10D, patterning the hazy layer SIO using the black matrix BM as a mask, the portions of the hazy layer SIO covering the open area AA are removed. The interface between the black matrix BM and the hazy layer SIO has the highered roughness, and the black matrix BM and the hazy layer SIO are stacked. On the other hands, in the open area AA, there is no hazy layer SIO. (referring to S40 in FIG. 11)

Figure 10E:
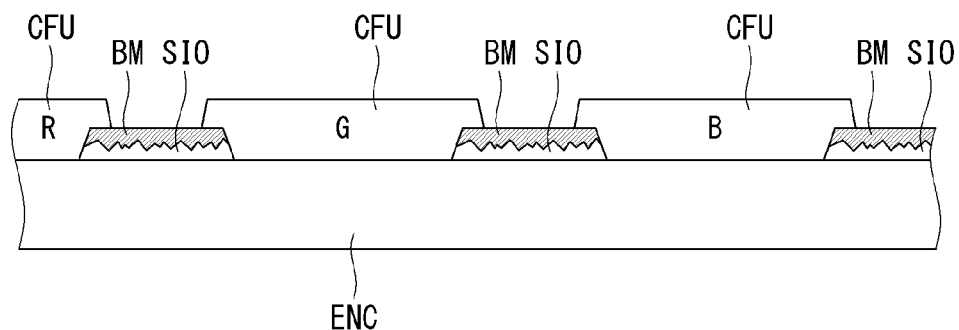

As shown in FIG. 10E, an upper color filter CFU is formed in the non-open area NA. Especially, a red color filter R, a green color filter G and a blue color filter B are sequentially disposed. After that, even though it is not shown in the figures, the thin film transistors ST and DT are formed, the color filter CF is formed, and the organic light emitting diode OLE including the anode electrode ANO, the organic light emitting layer OL and the cathode electrode CAT is formed, on the lower substrate SUB. Then, the encap substrate ENC and the lower substrate SUB are joined and attached each other, as each open area AA and each non-open area NA are corresponding each other so that the organic light emitting diode display is completed. (referring to S50 in FIG. 11)

As mentioned above, in the preferred embodiments of the present disclosure, the organic light emitting diode display has a hazy layer SIO for scattered reflecting or for diffused reflecting the outer light so that the light reflected by the black matrix BM cannot be directly reflected to the user's sight range but can be scattered or diffused. In the related art, a polarization sheet or plate may be attached to the outside of the surface facing the user. In that case, the transmissivity is remarkably lowered. However, according to the present disclosure, there is no requirement for the polarization sheet or plate, so that the light transmissivity is not degraded. That is, it is possible to get higher brightness or luminescence with a lower power consumption.

Further, by just inserting a low reflective material between the substrate and the black matrix, it has limitation for reducing the reflections of the outer light by the black matrix BM. However, in the present disclosure, a hazy layer SIO having the highered roughness is inserted between the black matrix BM and the substrate SUB or ENC. The hazy layer SIO makes the reflected light as the scattered-reflected or diffused-reflected light. Therefore, the reflectiveness of the outer light can be remarkably reduced.

For example, when there is a black matrix BM only, the reflection of the outer light by the black matrix BM is at least 8%. However, with a hazy layer SIO between the black matrix BM and the substrate SUB or ENC, the reflection of the outer light is at most 6%. That is, the reflectiveness is at least 20% more lowered. In other hands, when the inorganic layer SI is inserted without performing the surface treatment for increasing the roughness, the reflectiveness of the outer light is the same with when there is a black matrix BM only. The inorganic material such as the silicon oxide SiOx, the silicon nitride SiNx or the amorphous silicon a-Si has the property of absorbing the light. In actual condition, by just adding the inorganic layer, the reflectiveness cannot be lowered to wanted grade. Consequently, the hazy layer SIO having the highered roughness by conducting a surface treatment is more effective for reducing the reflectiveness of the outer light than just adding an inorganic layer SI.

In addition, if required, the hazy layer SIO may be disposed in the open area AA. However, in the best mode of the present disclosure, the hazy layer SIO is disposed in the non-open area NA only. When the hazy layer SIO may be disposed in the open area AA, the light from the organic light emitting layer OL may be diffused or scattered so that the color purity may be degraded. Therefore, it is preferable that the hazy layer SIO is disposed in the non-open area NA only.

According to the present disclosure, the flat panel display includes a hazy layer for preventing the light from being directly reflected to user sight by the black matrix formed in the substrate at the observation side of the user. Especially, the hazy layer has high roughness formed by surface treatment. As the result, the reflective light by the black matrix can be remarkably reduced. Further, without any polarization sheet or plate, the color quality can be ensured. As the polarization sheet or plate is not required, the structure can be simplified and the manufacturing cost can be reduced. In addition, with lower power consumption, the brightness and the light transmissivity can be enhanced.

It will be apparent to those skilled in the art that various modifications and variations can be made in the present invention without departing from the spirit or scope of the invention. Thus, it is intended that the present invention cover the modifications and variations provided they come within the scope of the appended claims and their equivalents.

What is claimed is:
1. A flat panel display, comprising:
a substrate including an open area and a non-open area;
a hazy layer only on the non-open area on the inner surface of the substrate, the hazy layer being configured to scatter or diffuse ambient light;
a black matrix directly on the hazy layer;
a driving element in on the non-open area; and
a display element on the open area and driven by the driving element.

2. The device of claim 1, wherein an interface between the hazy layer and the black matrix has greater roughness than an interface between the hazy layer and the substrate, for scattering or diffusing the ambient light from outside of the substrate.

3. The device of claim 1, wherein video information is transmitted outside of the device through the substrate through the open layer.

4. The device of claim 1, wherein the hazy layer includes at least one of: a silicon oxide, a silicon nitride, and an amorphous silicon.

* * * * *